(12) United States Patent  
Agrawal et al.

(10) Patent No.: US 7,208,975 B1
(45) Date of Patent: Apr. 24, 2007

(54) SERDES WITH PROGRAMMABLE I/O ARCHITECTURE

(75) Inventors: Om P. Agrawal, Los Altos, CA (US); Jock Tomlinson, Hillsboro, OR (US); Kuang Chi, San Jose, CA (US); Ji Zhao, San Jose, CA (US); Ju Shen, San Jose, CA (US); Jinghui Zhu, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 129 days.

(21) Appl. No.: 11/040,772

(22) Filed: Jan. 20, 2005

(51) Int. Cl.
*H03K 19/173* (2006.01)

(52) U.S. Cl. .......................... 326/38; 326/41
(58) Field of Classification Search ............. 326/37–41
See application file for complete search history.

(56) References Cited

U.S. PATENT DOCUMENTS

| | | | |
|---|---|---|---|
| 6,617,877 B1 * | 9/2003 | Cory et al. ................... | 326/41 |
| 6,650,141 B2 | 11/2003 | Agrawal et al. | |
| 6,653,861 B1 | 11/2003 | Agrawal et al. | |
| 6,661,254 B1 | 12/2003 | Agrawal et al. | |
| 6,703,860 B1 | 3/2004 | Agrawal et al. | |
| 6,864,710 B1 * | 3/2005 | Lacey et al. .................. | 326/39 |
| 6,903,575 B1 * | 6/2005 | Davidson et al. ............. | 326/47 |
| 7,020,728 B1 * | 3/2006 | Jones et al. .................. | 710/305 |

OTHER PUBLICATIONS

"The ispGDX® 2 Family White Paper", Oct. 2002, 9 pp., Lattice Semiconductor Corporation.

Dr. Om P. Agrawal, "Non-Volatility and Infinite Reconfigurability in PLDs", White Paper, 4 pp., Lattice Semiconductor Corporation, Hillsboro, OR.

"DS92LV010A Bus LVDS 3.3/5.0V Single Transceiver", May 1998, 10 pp., National Semiconductor Corporation.

"Virtex-II Pro™ FPGAs, The Highest System Performance, The Lowest System Cost", 2004, 2 pp., Xilinx Inc.

"Single-channel HOTLink II™ Transceiver, CYP15G0101DXB, CYV15G0101DXB", Revised Mar. 16, 2004, 39 pp., Document #: 38-02031 Rev. *1, Cypress Semiconductor Corporation, San Jose, CA.

Om P. Agrawal, Jinghui Zhu, "Block Oriented Architecture For a Programmable Interconnect Circuit", U.S. Appl. No. 10/022,464, filed Dec. 14, 2001.

* cited by examiner

*Primary Examiner*—Don Le
(74) *Attorney, Agent, or Firm*—MacPherson Kwok Chen & Heid LLP; Jonathan W. Hallman (57) ABSTRACT

In one embodiment, a programmable interconnect includes SERDES circuits dedicated to communicating high-speed data and input/output (I/O) circuits dedicated to communicating low-speed data. A routing structure is configurable to couple a SERDES circuit to another SERDES circuit, a SERDES circuit to an I/O circuit, an I/O circuit to a SERDES circuit, and an I/O circuit to another I/O circuit over routing paths having deterministic routing delays. In another embodiment, the routing structure includes a high-speed routing structure for communicating high-speed data to and from a SERDES circuit and a low-speed routing structure for communicating low-speed data to and from an I/O circuit.

20 Claims, 12 Drawing Sheets

SERDES WITH PROGRAMMABLE I/O ARCHITECTURE

TECHNICAL FIELD

The present invention relates to programmable interconnect circuits and more particularly to an interconnect circuit including serializer/deserializers (SERDES) with dedicated pins.

BACKGROUND

As data transmission rates continue to increase, parallel data transmission in backplane and other interconnect applications suffer from effects such as co-channel interference and EMI. To ameliorate the problems associated with high-speed parallel data transmission, parallel data may be serialized before transmission and then de-serialized upon reception using serial transmission protocols such as a low voltage differential signaling protocol (LVDS) or differential current mode logic (CML). For example, LVDS uses high-speed circuit techniques to provide multi-gigabit data transfers on copper interconnects and is a generic interface standard for high-speed data transmission. LVDS system features, such as synchronizing data, encoding the clock and low skew, all work together for higher performance. Skew is a big problem for sending parallel data and its clock across cables or PCB traces because the phase relation of the data and clock can be lost as a result of different travel times through the link. However, the ability to serialize parallel data into a high-speed signal with an embedded clock eliminates the skew problem. The problem disappears because the clock travels with the data over the same differential pair of wires. The receiver uses a clock and data recovery circuit to extract the embedded-phase-aligned clock from the data stream. The recovered clock is then used by a data recovery component to identify the bits in the transmitted codeword.

To permit the transition between parallel and serial data transmission, serializer/deserializer (SERDES) circuits are incorporated at both the transmitting and receiving ends of the serial data stream. The resulting interfacing between high-speed serial data and low-speed parallel data transmission has lead to the development of interconnect structures that provide connectivity between SERDES input/output (I/O) data traffic and low-speed I/O data traffic. A number of alternative architectures have been developed to address connectivity of SERDES I/O with low-speed I/O such as field programmable gate arrays (FPGAs) having embedded SERDES, application specific standard product (ASSP), and programmable interconnect switches. FPGA approaches, however, suffer from non-deterministic routing delays and expensive overhead. Although ASSP approaches offer deterministic routing delays, they suffer from their lack of programmability in that users don't have the flexibility of assigning parallel I/O pins as desired. In contrast, the programmable interconnect approach offers the programmability advantages of FPGA approaches and the deterministic routing delay advantages of ASSPs without suffering from their associated drawbacks.

Figure 1:
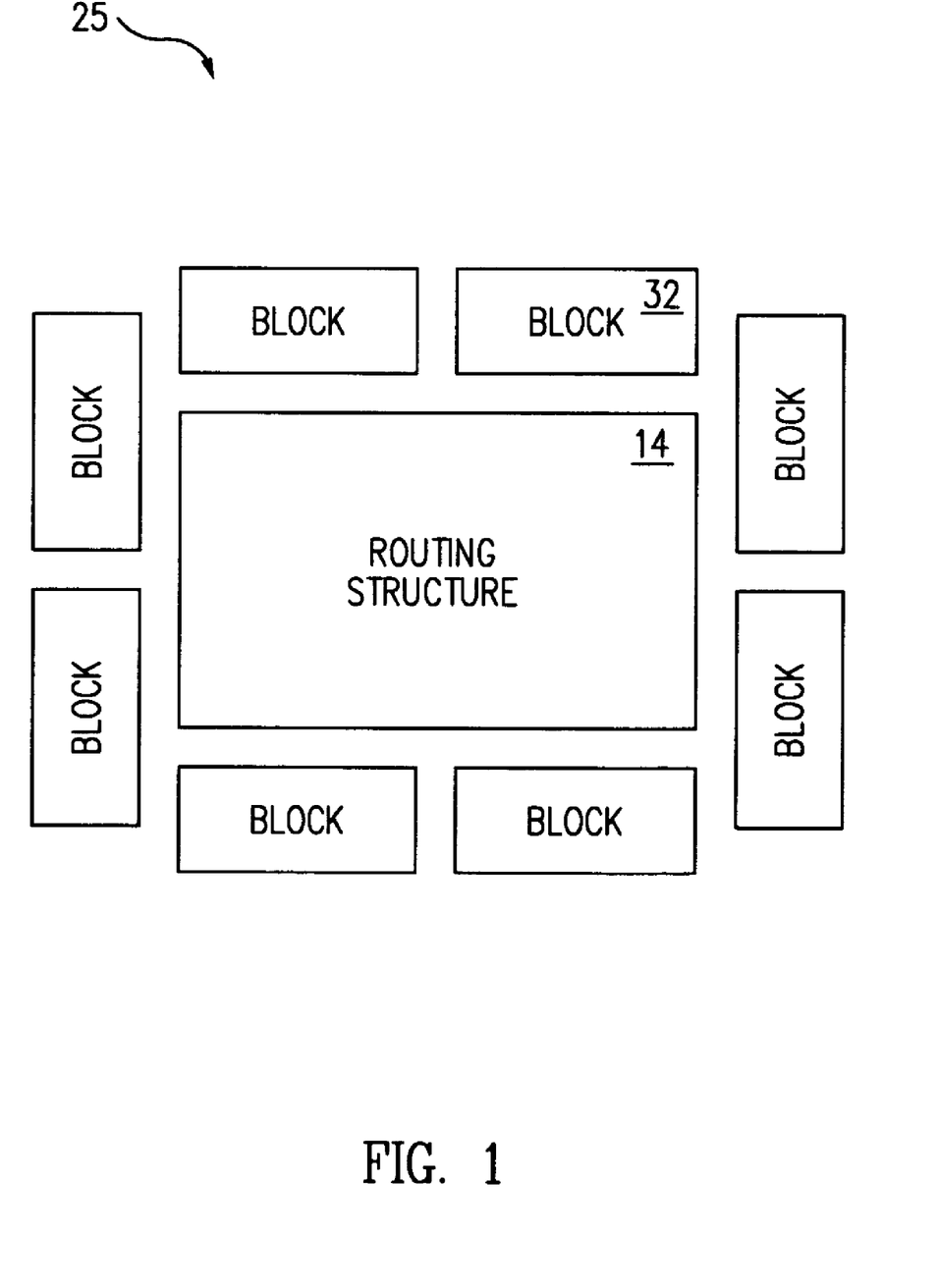
FIG. 1 is a block diagram of a programmable interconnect circuit having a block-oriented routing structure, wherein each block includes both high-speed and low-speed I/O capabilities.

Turning now to FIG. 1, a block-based (which may also be denoted as "block-oriented) programmable interconnect circuit 25 is illustrated. As suggested by the "block-oriented" denotation, the input/output architecture for programmable interconnect circuit 25 includes a plurality of blocks 32 of I/O circuits (not illustrated). Each I/O circuit associates with a pin (not illustrated) for circuit 25 and includes input/output registers for the storage of incoming and outgoing signals over the pin. A routing structure 14 routes input and output signals amongst the blocks 32. The number of I/O circuits within each block 32 is arbitrary but may be conveniently matched to well-known bus widths such as 8 or 16 bits. In this fashion, the block-oriented architecture shown in FIG. 1 may accommodate bus-switching applications.

Each block 32 includes I/O cells that may communicate both low-speed I/O and high-speed (SERDES) I/O. As used herein, "high-speed data" refers to serial data provided to or from a SERDES. In that sense, a SERDES may receive serial data transmitted at a relatively high rate and deserialize the data into data words that are then transmitted at a relatively low rate. For example, an 8-bit parallel word may be serialized in a transmitting SERDES into a 10-bit serial word that may be decoded into the same 8-bit parallel data word in a receiving SERDES. The actual data content would be the same for both serial and parallel transmission in that the 10-bit serial word only had a data content of 8 bits, the extra bits being used to provide sufficient edge transitions to encode a clock. Parallel data words that are not serialized and coupled through a SERDES but are instead just coupled through the programmable interconnect architecture are denoted herein as "low-speed data" or "low-speed I/O." It will be appreciated, however, that what is relatively low speed about low-speed data is the word rate as compared to the serial bit transmission rate of high-speed data. For example, if serial high-speed data is transmitted at a certain bit rate, the same serial data may be de-serialized into 8-bit parallel data words and these words transmitted at a rate 8 times slower while still achieving the same overall data transmission rate. In that regard, transmission of low-speed data may achieve the same or higher overall data transmission rate as transmission of high-speed data.

Because each block 32 includes I/O cells that may communicate both high speed and low-speed data, each block 32 will require its own SERDES. The die area demands from SERDES circuits can be substantial. Accordingly, there is a need in the art for SERDES-containing programmable interconnect circuits that efficiently use die area.

SUMMARY

In accordance with one aspect of the invention, a programmable interconnect circuit is provided that includes: a plurality of SERDES circuits dedicated to communicating high-speed data; a plurality of input/output (I/O) circuits dedicated to communicating low-speed data; and a routing structure configurable to couple a SERDES circuit to another SERDES circuit, a SERDES circuit to an I/O circuit, an I/O circuit to a SERDES circuit, and an I/O circuit to another I/O circuit over routing paths having deterministic routing delays.

In accordance with another aspect of the invention, a programmable interconnect circuit is provided that includes: a plurality of SERDES circuits; a plurality of input/output (I/O) blocks, each I/O block including a plurality of I/O circuits; and a routing structure configurable to receive input signals from the plurality of I/O blocks and the plurality of SERDES circuits and for programmably routing with deterministic delays the received input signals to selected I/O blocks and to selected SERDES circuits.

In accordance with another aspect of the invention, a method of programmably routing signals through a programmable logic device is provided that includes the acts of: providing in the device a plurality of SERDES circuits dedicated to communicating high-speed data, a plurality of input/output (I/O) circuits dedicated to communicating low-speed data, and a routing structure configurable to couple any of the I/O circuits or SERDES circuits to any of the other I/O circuits or SERDES circuits; to route a low-speed data signal through the device, configuring the routing structure to couple an I/O circuit to another I/O circuit; to route a high-speed data signal through the device, configuring the routing structure to couple a SERDES circuit to another SERDES circuit; to convert a low-speed input data signal to a high-speed output data signal, configuring the routing structure to couple an I/O circuit to a SERDES circuit; and to convert a high-speed input data signal to a low-speed output data signal, configuring the routing structure to couple a SERDES circuit to an I/O circuit.

DETAILED DESCRIPTION

To provide enhanced programmable interconnectivity for both low speed and high-speed serializer/deserializer (SERDES) data, a programmable interconnect circuit architecture is provided that, in some embodiments, includes dedicated pins or pads for the high-speed data. Independent routing structures are used to route the high-speed and low-speed data. In this fashion, the routing structures may be specialized for their intended purposes, providing a substantial die savings over the use of a routing structure that is generic to both the high-speed and low-speed data.

Figure 2A:
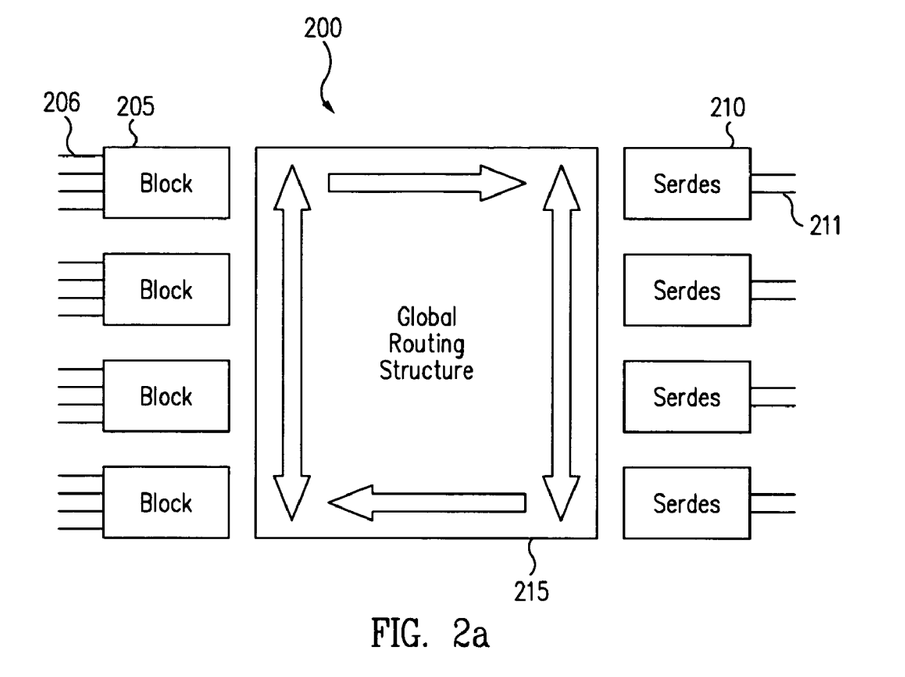
FIG. 2a is a block diagram of a programmable interconnect circuit having separate SERDES and I/O blocks coupled by a global routing structure according to an embodiment of the invention.

Turning now to FIG. 2a, an exemplary embodiment of a programmable interconnect circuit 200 is illustrated. Rather than have a generic block of I/O circuits that accommodate the communication of both high-speed and low-speed data, I/O blocks 205 of I/O low-speed circuits (discussed further below) are specialized for receiving only low-speed data from external devices in some embodiments. Similarly, in some embodiments, other I/O circuits are specialized for the serializing/deserializing of high-speed data such as SERDES circuits 210. Pins 206 for I/O blocks 205 and pins 211 for SERDES 210 may be dedicated to the communication of low-speed and high-speed data, respectively. In that regard, pins 206 may be designated as "low-speed" pins and pins 211 as "high-speed" pins. A programmable global routing structure 215 couples to the I/O blocks 205 and SERDES 210. Routing structure 215 is denoted as a "global" routing structure because it may route signals selected from the same total pool to each I/O block 205 and SERDES 210. For example, suppose each I/O block 205 may receive a 16-bit input word and couple the 16-bit word to global routing structure 215. The total number of low-speed data bits would thus be sixteen times the number of I/O blocks 215 contained within programmable interconnect circuit 200. Similarly, if each SERDES 210 can couple a sixteen-bit input word to global routing structure, the total number of high-speed data bits would thus be sixteen times the number of SERDES 210 contained within programmable interconnect circuit 200. The total pool of input signals available for routing by global routing structure 215 is the sum of the high-speed and low-speed data bits. Depending upon the programming of global routing structure 215, certain signals are selected from this input pool and routed to selected I/O blocks 205 and SERDES 210. For example, low-speed data from one I/O block may be routed to another I/O block or to a SERDES. Similarly, high-speed data from one SERDES may be routed to another SERDES or to an I/O block. In that regard, programmable interconnect circuit 200 provides low-speed to low-speed, low-speed to high-speed, high-speed to low-speed, and high-speed to high-speed interconnectivity, all simultaneously or alternatively.

Because the routing occurs through a global routing structure 215, the routing delays are deterministic. In that regard, programmable interconnect circuit 200 enjoys a considerable advantage over the conventional FPGA implementation described previously in that the routing delays in an FPGA are non-deterministic. With respect to the block-oriented programmable interconnect circuit 25 discussed with respect to FIG. 1 wherein each block includes both low-speed and high-speed capability, programmable interconnect circuit 200 provides a die space savings in that SERDES demand considerable die area for their implementation. By specializing, in some embodiments, I/O blocks 205 for just the transmission of low-speed data and SERDES 210 for the transmission of high-speed data, the available die space may be apportioned as necessary between SERDES and I/O blocks.

Figure 2B:
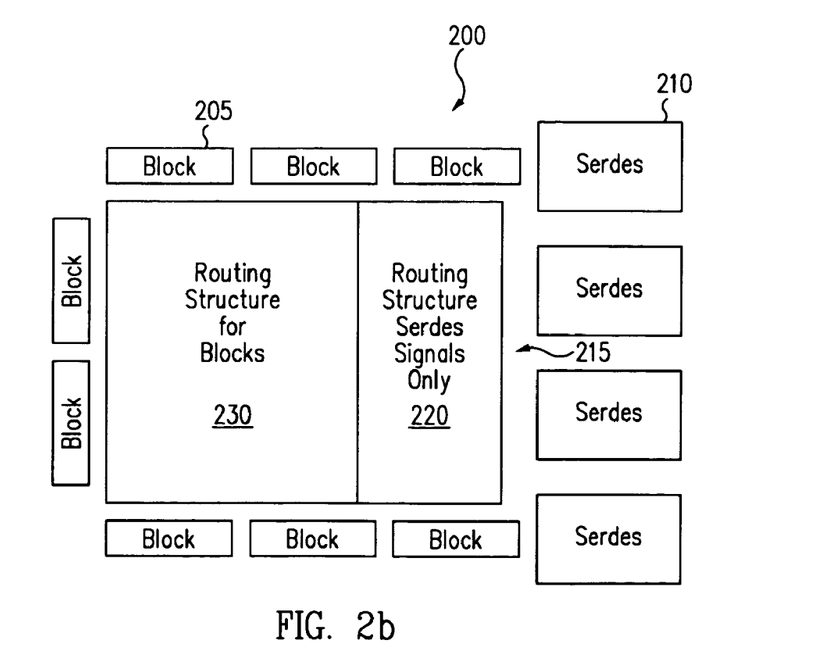
FIG. 2b is a block diagram of a block diagram of a programmable interconnect circuit having separate SERDES and I/O blocks coupled by a global routing structure specialized into separate SERDES and low-speed routing structures according to an embodiment of the invention.

A die space savings is not the only advantage programmable interconnect circuit 200 provides. Because each SERDES 210 communicates over high-speed pins that do not accommodate low-speed data, global routing structure 215 may be divided into a separate SERDES routing structure 220 and a low-speed routing structure 230 as illustrated in FIG. 2b. SERDES routing structure is specialized for programmably routing signals to and from each SERDES 210. In that regard, SERDES routing structure 220 may also be denoted as a "high-speed routing structure." Low-speed routing structure 230 is specialized for programmably routing signals to and from I/O blocks 205. Each I/O block 205 associates with its own low-speed routing structure 230 as does each SERDES 210 associate with its own SERDES routing structure 220. However, for illustration clarity, only one SERDES routing structure 220 and low-speed routing structure 230 is shown.

Figure 3:
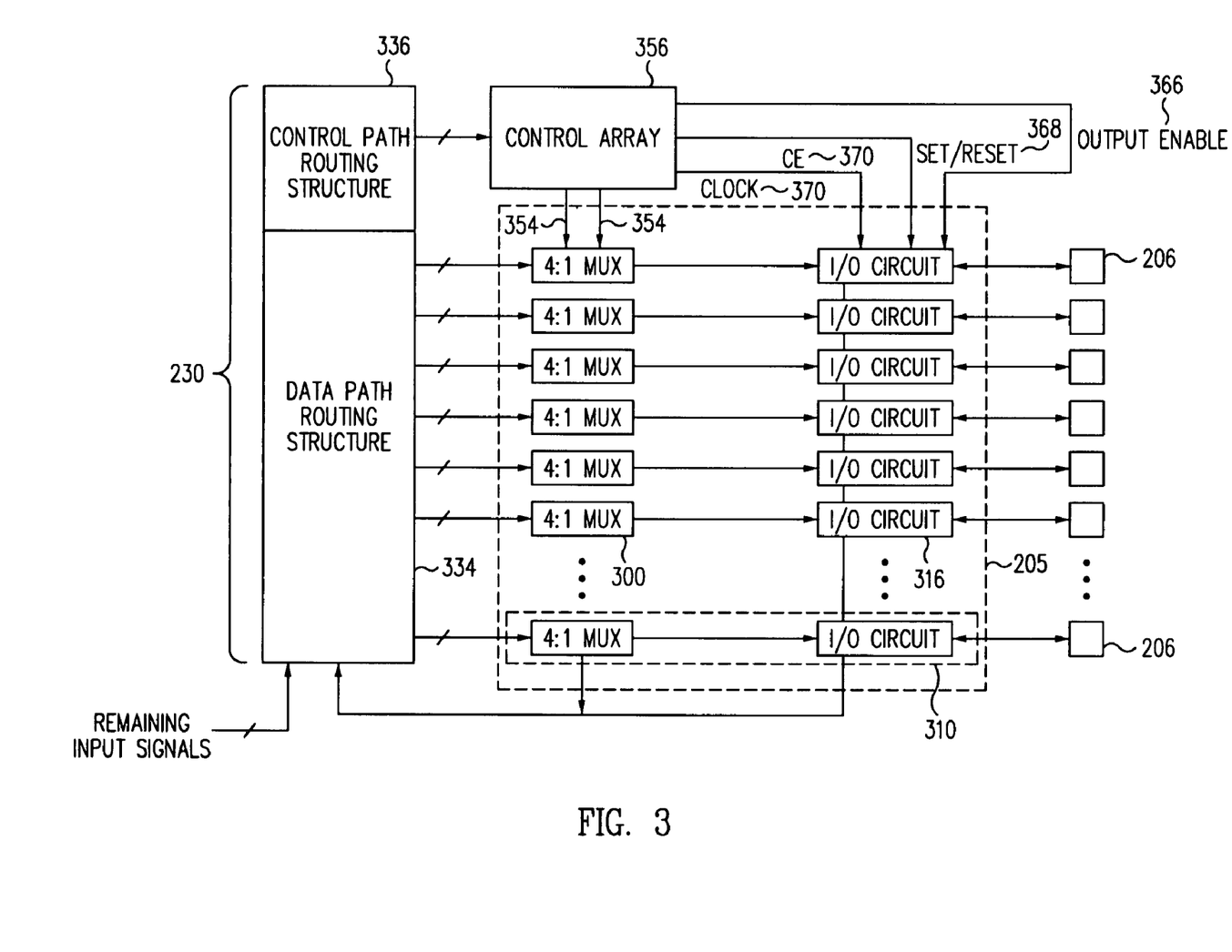
FIG. 3 illustrates further aspects of the block-oriented routing to an I/O block of the programmable interconnect circuit of FIG. 2b according to an embodiment of the invention.

As will be explained further herein, the specialization of the I/O into high-speed and low-speed functions as well as the specialization of the routing structures provides substantial performance improvements as well as reducing die area demands. These advantages may be better understood in light of the block-oriented routing architecture for a low-speed routing structure 230 illustrated in FIG. 3 and its associated exemplary I/O block 205. I/O block 205 includes a plurality of low-speed I/O circuits 316. As suggested by the term "block-oriented," routing structure 230 communicates to I/O block 205 as a group. In that regard, it may also be denoted as a block routing structure. In other words, when low-speed I/O circuits 316 within I/O block 205 receive signals from low-speed routing structure 230, these signals are selected from the same group of signals that is provided to I/O block 205 by routing structure 230. As will be discussed further with respect to FIG. 4, each low-speed I/O circuit 316 may include separate input and output registers to provide true bi-directional input and output capabilities with respect to its low-speed pin(s) 206. As is conventional in the programmable interconnect arts, each output register associates with a 4:1 multiplexer 300 that selects from the group of signals provided by routing structure 230. Each low-speed I/O circuit 316 and its associated 4:1 multiplexer 300 may be denoted as an I/O cell 310, of which just one is shown in FIG. 3 for illustration clarity. The number of low-speed I/O circuits 316 within each I/O block 205 is arbitrary. However, because bus-switching applications typically route data signals in groups of eight (one byte) or sixteen (two bytes), assigning sixteen low-speed I/O circuits 316 per I/O block 205 is particularly convenient for such applications. In such an embodiment, an external sixteen-bit wide data bus (or narrower) could be routed through programmable interconnect circuit 200 as low-speed data from one I/O block 205 to another I/O block 205 or to a SERDES 210.

Figure 4:
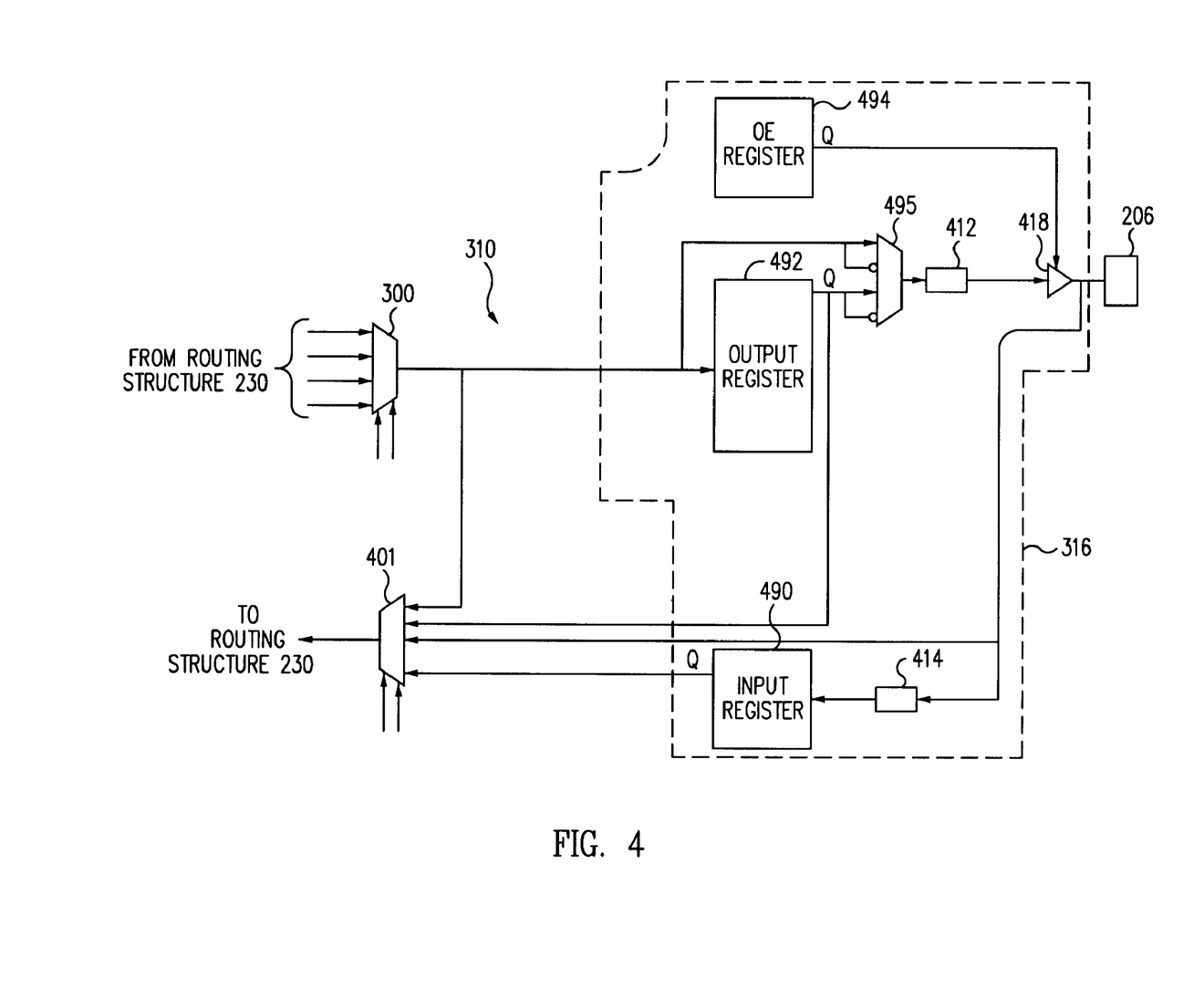
FIG. 4 is a schematic illustration of an I/O circuit in the I/O block of FIG. 4 according to an embodiment of the invention.

Turning now to FIG. 4, an embodiment for low-speed I/O circuit 316 of FIG. 3 has an input register 490 and an output register 492 separated, providing true bi-directional input and output capabilities. A 4:1 MUX 300 selects among four input signals from the signals provided to the corresponding I/O block 205 (FIG. 3) by routing structure 230. Output register 492 receives the output of 4:1 MUX 300 and provides a registered output signal Q to an output buffer 418, which in turn provides an output signal to its low-speed pin 206. An output enable (OE) register 494 controls the output buffer 418. Input register 490 may receive an input signal from its low-speed pin 206. A feedback or input MUX 401 for I/O cell 310 selects outputs from the 4:1 MUX 300, the output register 492, and the input register 490, providing a fast feedback path to its I/O block's routing structure 230.

An output register bypass MUX 495 selects between either the registered output Q of output register 492 or the unregistered output of 4:1 MUX 300. In this fashion, output buffer 418 may receive either a registered or unregistered output signal. In addition, output register bypass MUX 495 may provide polarity control for either output signal. To prevent ground bounce, output register bypass MUX 495 couples to output buffer 418 through a programmable delay element 412. Similarly, another programmable delay element 414 adjusts the hold time of the input register 490. Each register 490, 492, and 494 and 4:1 MUX 300 within low-speed I/O circuit 316 receives product-term control signals from a control array 356 (FIG. 3) that will be discussed further herein. For example, with respect to the control of each 4:1 MUX 300, control array 356 produces product-term MUX select signals 354.

Referring back to FIG. 3, routing structure 230 may be organized into a data path routing structure 334 and a control path routing structure 336 to provide flexible data path and control path routing capabilities. In general, the routing flexibility needed for control array 356 is less robust than the flexibility needed for data path routing. Thus, by organizing routing structure 230 in this fashion, die demands are lessened in that the switch matrix implemented in control path routing structure 336 may require fewer fuse points as will be explained further. The number of signals that may be routed through routing structure 230 (and thus through data path routing structure 334 and control path routing structure 336) depends upon the architecture of programmable interconnect circuit 200. For example, exemplary programmable interconnect circuit 200 includes seven low-speed I/O blocks 205. If each I/O block 205 includes sixteen low-speed I/O circuits 316 there would thus be one hundred and twelve low-speed data signals that may need routing. The number of high-speed data signals provided by each SERDES 210 depends upon the particular SERDES architecture being implemented. Without loss of generality, this number will be assumed to be sixteen. Because programmable interconnect circuit 200 includes four SERDES 210, the number of high-speed signals provided would be 64 in such an embodiment. Thus, the total pool of available signals, both low speed and high speed, would be 176 for this embodiment.

Figure 5:
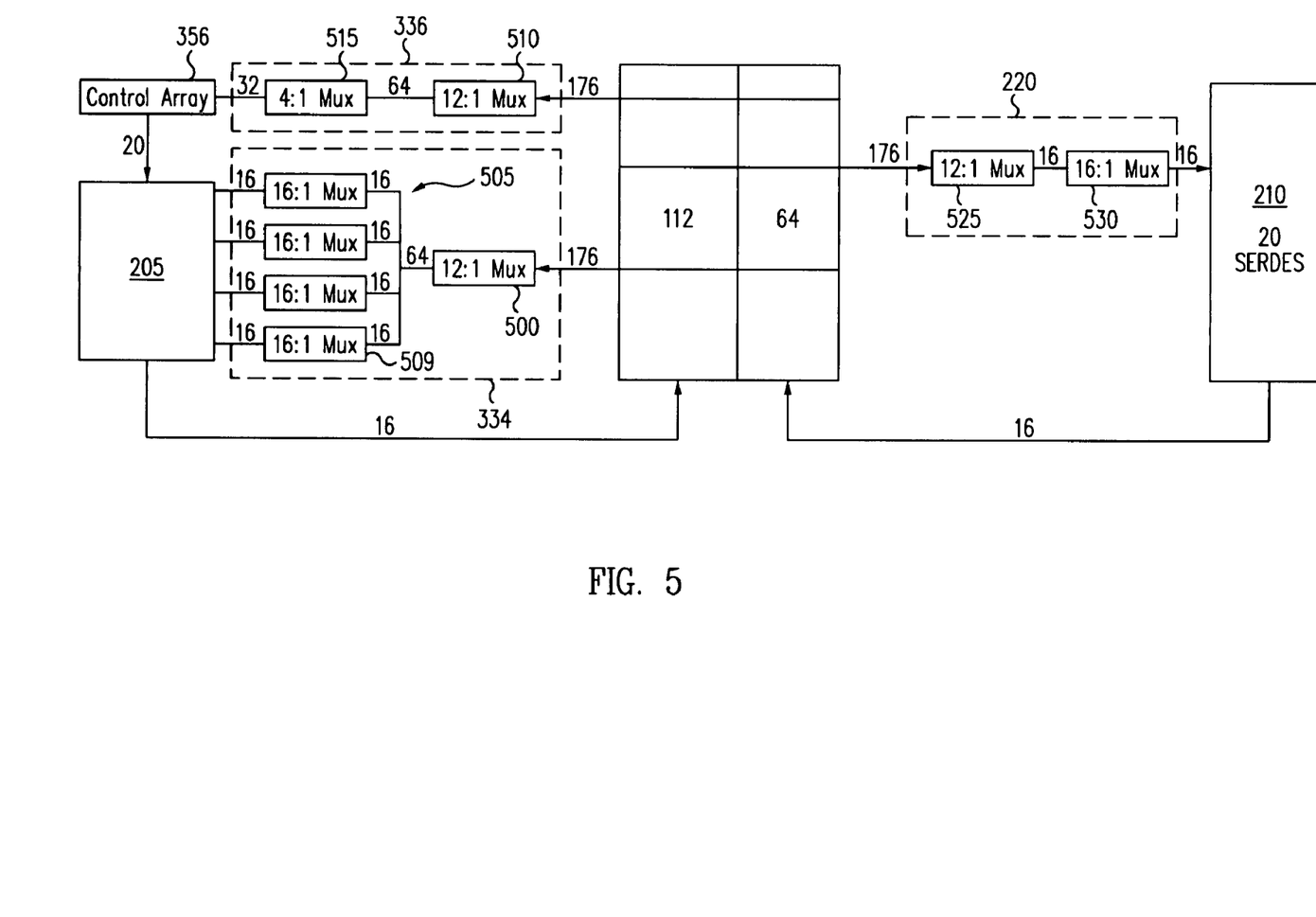
FIG. 5 illustrates the high-level routing architecture for a low-speed and a SERDES routing structure according to an embodiment of the invention.

This pool of available signals is illustrated in FIG. 5 with respect to the routing to both an I/O block 205 and a SERDES 210. In one embodiment, data path routing structure 334, control path routing structure 336, and SERDES routing structure 220 are each organized into a multi-level architecture. In such a multi-level architecture, the stages have different switch matrix fuse populations as will be explained further. As seen in FIG. 5, data-path routing structure 334 comprises first stage data-path routing structure 500 and second stage data-path routing structure 505. Similarly, control-path routing structure 336 is formed from first stage control-path routing structure 510 and second stage control-path routing structure 515. SERDES routing structure 220 comprises first stage SERDES routing structure 525 and second stage SERDES routing structure 530. The routing flexibility will depend upon the fusing population in these routing structures' switch matrices. The greater the number of fuses, the more flexible the routing may be. For example, to permit a maximum-achievable swapping of input bits, a switch matrix should be fully populated. However, routing structures with fully populated switch matrices demand a great deal of die area. By implementing the routing structures using multiple stages, this die area demand may be reduced.

Figure 6:
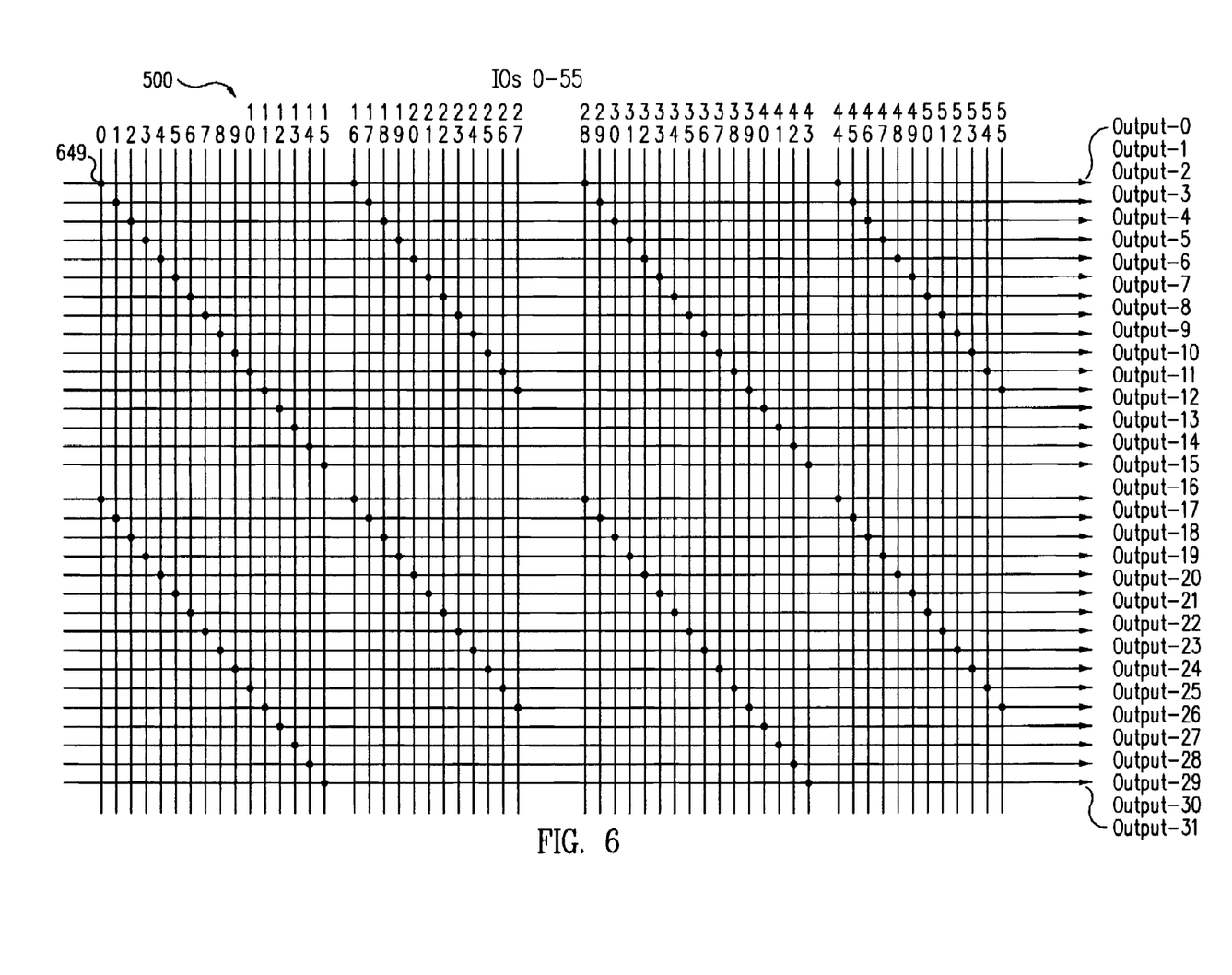
FIG. 6 illustrates a portion of a first level data-path routing structure according to an embodiment of the invention.

For example, a partially populated fusing pattern for a portion of the switch matrix in first level data-path routing structure 500 is illustrated in FIG. 6. The number of output signals provided by first level data-path routing structure 500 is arbitrary. However, in an embodiment wherein each I/O block 205 includes sixteen low-speed I/O circuits 316 and each low-speed I/O circuit 316 receives inputs selected by a corresponding 4:1 multiplexer 300 as illustrated in FIG. 3, the total number of input signals provided by data-path routing structure 230 in such an embodiment is sixty-four. Accordingly, it is convenient to implement first level data-path routing structure 500 to provide the same number of outputs, namely, sixty-four. For illustration clarity, FIG. 6 illustrates only a portion of the switch matrix for first level data-path routing structure 500: a subset of 56 input signals from the total input pool of 176 signals are shown as I/O signals 0 through 55. Similarly, a subset of 32 output signals from the 64 output signals are illustrated as output signals 0 through 31. At each darkened intersection 649, a one-bit memory cell, typically an electrically erasable in-system-programmable read-only memory cell (E2PROM element), couples to a pass transistor to programmably fuse an input signal to an output signal. Thus, first level data-path routing structure 500 implements static routing. The resulting partially populated fusing pattern is repeated for remaining I/O signals 56 through 175 and output signals 32 through 63. The degree of fuse population is driven by the degree of routing flexibility desired. In the embodiment illustrated, first level data-path routing structure 500 is four-way routed in that each input signal has four different paths it may take to reach the output as follows. For example, I/O signal 0 may be fused at the intersections 649 to form output signals numbers 0 and 16 as shown. As this fusing pattern is repeated, I/O signal 0 may also be fused at other intersections (not illustrated) to form output signals 32 and 48 (not illustrated) thereby providing four ways for input signal number 0 to reach the output. If only two-way routability were desired, the fuse point count and hence die area demands would be reduced accordingly. On the other hand, if greater routability such as 8-way routability were desired, the fuse point count and die area demands would be increased accordingly. It will thus be appreciated that the degree of flexibility desired for first level data-path routing structure is a design choice and may be varied accordingly. In the four-way routable routing structure of FIG. 6, each output may select from 12 possible inputs such that first stage data-path routing structure 500 acts as a 12:1 multiplexer for each of its sixty-four outputs. For example, output 0 may select from input signals I/O 0, 16, 28, 44, and (not illustrated) I/O signals 56, 72, 84, 100, 112, 128, 144, and 160.

Figure 7:
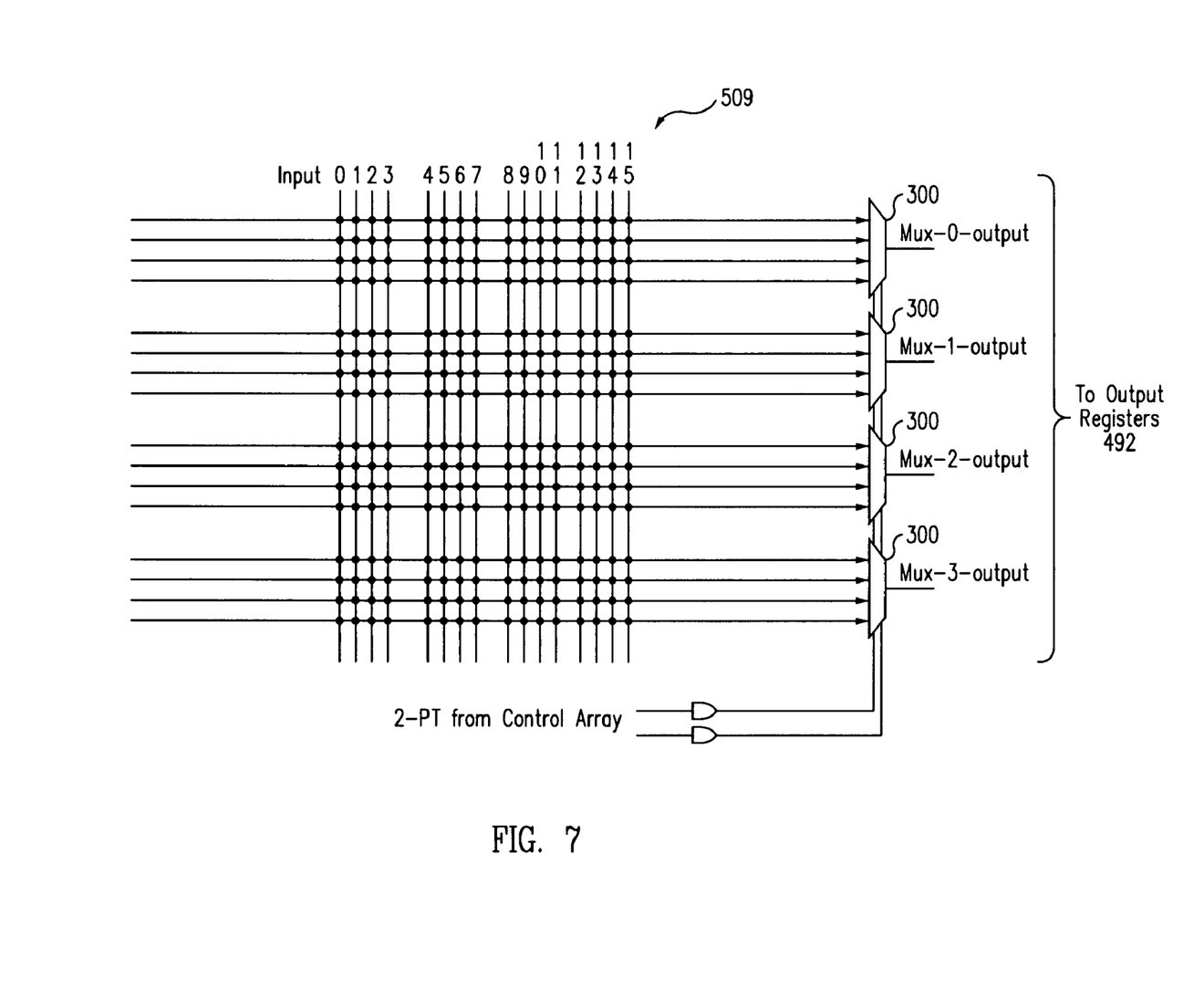
FIG. 7 illustrates a portion of the fusing pattern for a second level data-path routing structure according to an embodiment of the invention.

In some instances, a user may desire or require the ability to swap the order of inputs. For example, in a sixteen-bit wide input data word, a bit at bit position 0 may be interchanged with the bit at bit position 15 and so on. To facilitate complete flexibility in such a swapping, second level data-path routing structure 505 may comprises a fully populated switch matrix. Another factor affecting the design of second stage data-path routing structure 505 is the control of 4:1 multiplexers 300 in the corresponding block 205 (FIG. 3). If an assumption is made that groups of these multiplexers will not be switched independently, second stage data-path routing structure 505 may be organized accordingly. For example, 4:1 multiplexers 300 may be organized into four groups of four multiplexers each within each I/O block 205. Each such group will require routing for sixteen input signals. In such an embodiment, second stage data-path routing structure 505 may be organized into four routing structures 509, each routing structure 509 providing sixteen output signals as seen in FIG. 5. The fusing pattern for routing structure 509 is illustrated in FIG. 7.

Figure 8:
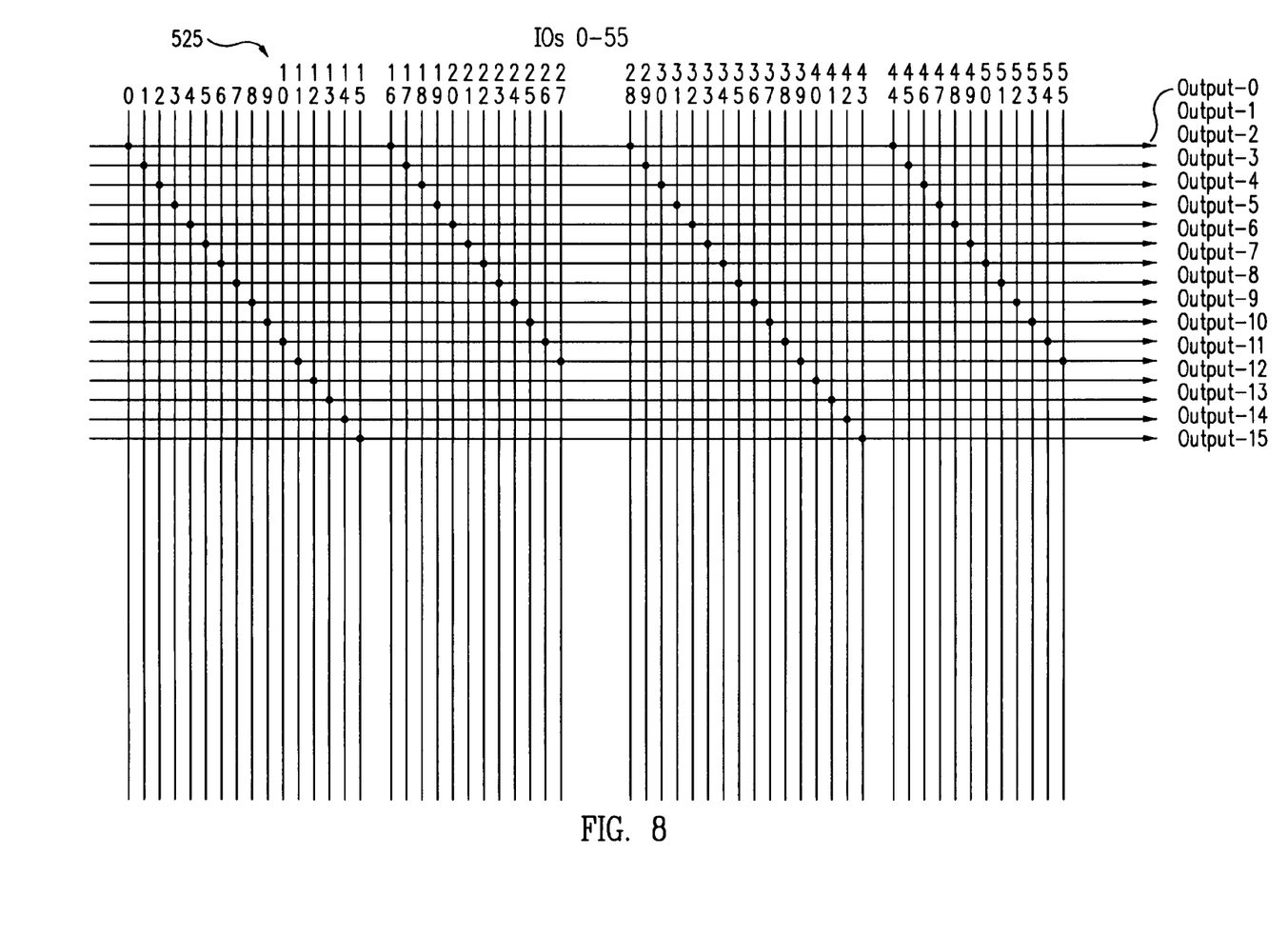
FIG. 8 illustrates a portion of the fusing pattern for a first level SERDES routing structure according to an embodiment of the invention.

First level SERDES routing structure 525 may be implemented analogously to first level data-path routing structure 500. However, the number of output signals may be tailored to the particular architecture implemented in each SERDES 210. For example, should each SERDES 210 require sixteen input signals, the number of output signals for first level SERDES routing structure 525 may be chosen accordingly. The number of input signals depends upon the total pool of input signals, both low speed and high speed, as discussed with respect to FIG. 5. Should that input pool be 176 signals and a 12:1 multiplexer function be desired for each output as was implemented in first level data-path routing structure 500, the fusing pattern may be implemented as shown in FIG. 8. For illustration clarity, only a portion of the fusing pattern is illustrated for input I/O signals 0 to 55. However, those of ordinary skill will appreciate that this fusing pattern is continued across the I/O signals 56 to 175 to complete first level SERDES routing structure 525.

Figure 9:
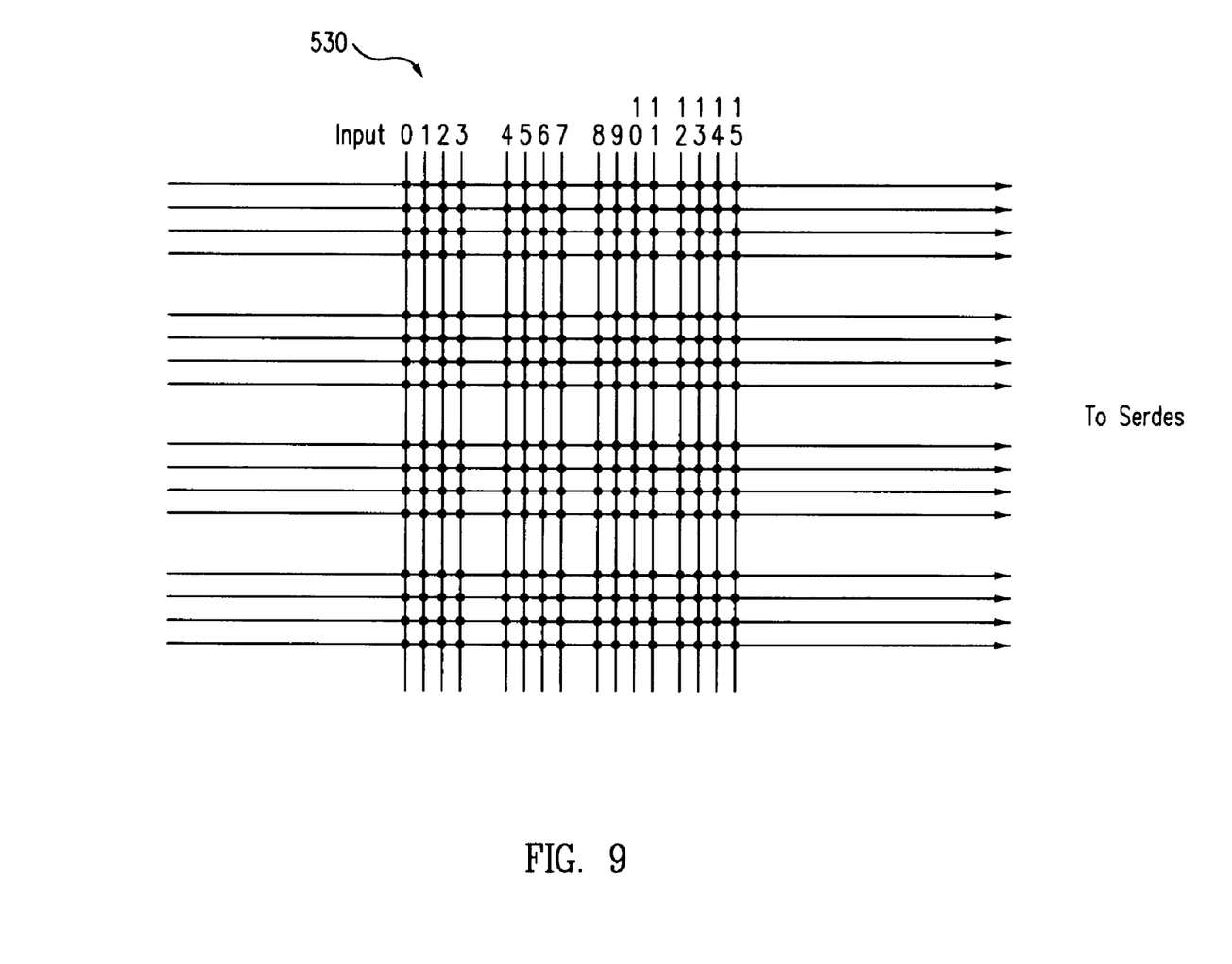
FIG. 9 illustrates the fusing pattern for a second level SERDES routing structure according to an embodiment of the invention.

To allow a completely flexible swapping of the signals provided by first level SERDES routing structure 525, second level SERDES routing structure 530 may comprise a fully populated switch matrix such that it acts as 16:1 multiplexer for each of its sixteen output signals as illustrated in FIG. 9. However, should a user not desire such a flexible routing capability, second level SERDES routing structure 530 may be only partially populated or disposed of entirely. A similar consideration applies to data path routing structure 230.

The routing needs for control path routing structure 336 are necessarily less rigorous in that control array 356 may implement product term logic. Because a product term is the logical AND of a number of selectable inputs, the order of the inputs has no effect on the resulting product term. Accordingly, swapping provides no benefit for control path routing structure 336 in such an embodiment. It follows that a simple, partially populated one stage routing structure would be adequate to supply inputs to control array 356. However, design considerations may be simplified if control path routing structure 336 is implemented in two stages, where a first stage control-path routing structure 510 is identical to first stage data-path routing structure 500. In this fashion, the layout generated for first stage data-path routing structure 500 may be reused for first stage control-path routing structure 510. The fusing pattern in first stage control-path routing structure 510 may thus be implemented as discussed with respect to FIG. 6. In such an embodiment, first stage control-path routing structure 510 provides sixty-four output signals.

Figure 10:
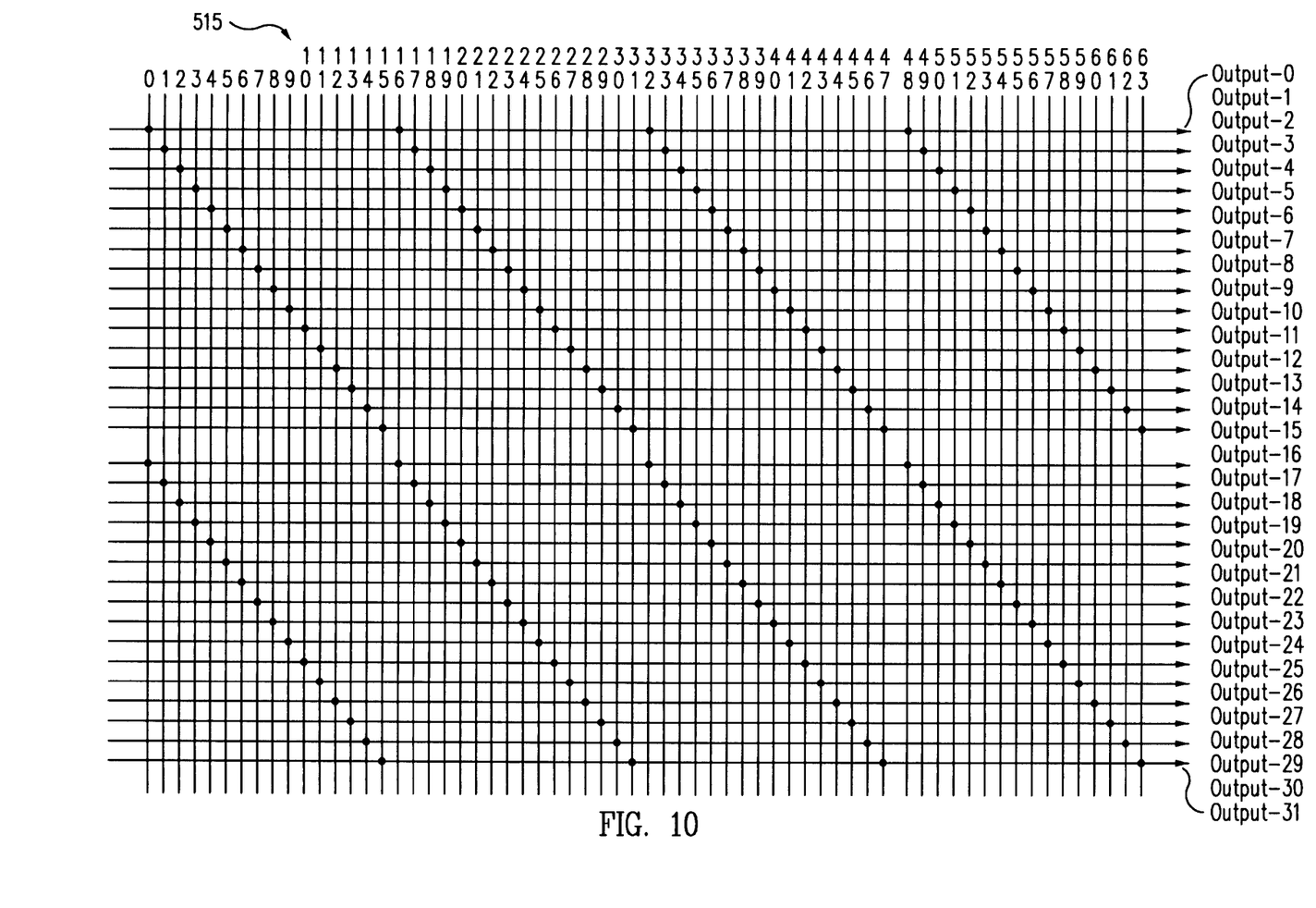
FIG. 10 illustrates the fusing pattern for a second level control-path routing structure according to an embodiment of the invention.
Figure 11:
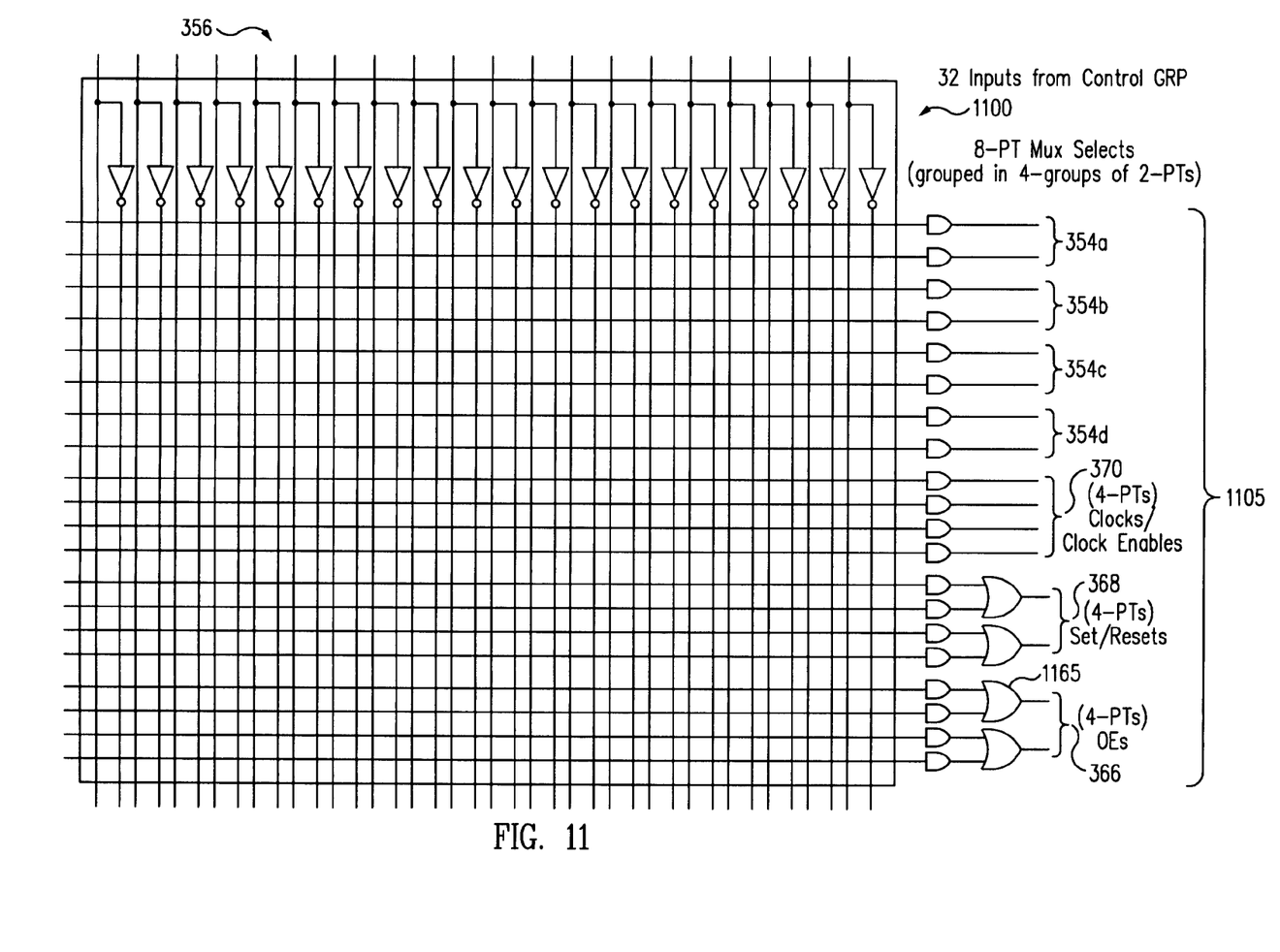
FIG. 11 illustrates a control array for an I/O block according to an embodiment of the invention.

The output signals from first stage control-path routing structure 510 could be routed directly to control array 356 without the implementation of a second stage routing structure. However, because the control needs may not be so robust as to require product terms of sixty-four inputs in control array 356, a second stage control-path routing structure 515 may be used to reduce this number of signals. For example, second stage control-path routing structure 515 may have the fusing pattern illustrated in FIG. 10 such that it forms a 4:1 multiplexer for each of thirty-two output signals. These output signals are received by control array 356, which may be implemented as seen in FIG. 11.

Control array 356 generates independent control functions for the control signals developed by the control-path routing structure 336. In one embodiment, an AND array 1100 form product-terms 1105. Product-terms 1105 may provide all the necessary control signals for the corresponding I/O block 205 illustrated in FIG. 3. Control array 356 receives both the true and complement of the outputs from second level control-path routing structure 515. For an embodiment having 32 output signals from control-path routing structure 336, AND array 1100 thus receives 64 signals. The number of product terms 1105 derived from the AND array 1100 depends upon the balance desired between fuse count and control function capability. Although a full CPLD-like AND-OR plane could be used, a satisfactory level of control function capability may provided by just an AND array or an AND array coupled with a limited OR plane capability, thereby minimizing the required number of fuses. As shown in FIG. 3, desired control signals include the MUX selects 354 for the 4:1 MUXes 300, output enable signals (OE) 366, set/resets 368, and clock and clock enable (CE) signals 370. To provide these control signals in one embodiment, AND array 1100 produces 20 product term outputs: 8 product-term MUX selects 354, four product-term clock/clock enable signals 370, four product-term set/resets 368, and four product-term OE signals 366. It will be appreciated that the actual number of each type of product-term control signal produced by AND array 1100 is arbitrary and is driven by a tradeoff between fuse count and flexibility. Because of the block-oriented data path routing structure, however, the control signals do not have to be generated on an individual I/O cell basis, resulting in a significant saving of fuse count and permitting optimization of array inputs to the control array. For example, because each 4:1 MUX 300 in an I/O cell 310 requires two MUX select signals 354, a fully independent control of all sixteen 4:1 MUXes 300 within the I/O block 205 of FIG. 3 requires 32 MUX select signals. However, such a degree of individual control would be wasted in a bus-switching application, wherein MUXes relating to signals on a given bus need not be switched independently of one another. Thus, as discussed with respect to FIG. 7, the sixteen 4:1 multiplexers in an I/O block 205 may be arranged into groups of four each, each group having the same control signals 354. AND array 1100 thus need only provide four sets of product-term MUX select signals 354a through 354d of two product-term signals each. Referring back to FIG. 3, signals 354a would control four of the 4:1 MUXes 300, signals 354b would control another four, and so on. A similar tradeoff between individual control and fuse count produces just four signals each for the product-term set/resets 368, clock/clock enables 370, and OE signals 366. However, to increase flexibility for the set/resets 368 and OE signals 366, each are arranged in sets of two product-term signals, each set having an AND-OR capability by using OR gates 1165. It will be appreciated that in other embodiments of the invention, OR capability could be provided for the clock/clock enable signals 370 as well. Alternatively, no OR capability could be provided should that type of control flexibility not be desired.

Traditionally, the formation of an AND array 1100 has required the use of sense amplifiers to provide the logical AND operation of its many inputs. It is difficult to scale, however, a sense amplifier to modern semiconductor sizes and power demands. Thus, in one embodiment, AND array 1100 may be formed as disclosed in U.S. Pat. No. 6,507,212, entitled "Wide Input Programmable Logic System and Method," issued Jan. 14, 2003, the contents of which are hereby incorporated by reference. AND array 1100 may thus be formed using a CMOS array fused by a novel electrically erasable non-volatile memory cell that requires no sense amplifiers.

Referring back to FIGS. 2a and 2b, it follows from the preceding discussion that a very flexible and powerful routing capability is provided by programmable interconnect circuit 200. Each SERDES 210 may receive externally provided high-speed serial signals and deserialize them into low-speed signals. As with the low-speed signals from blocks I/O 205, the deserialized high-speed signals from a SERDES 210 may be routed to either an I/O block 205 or to a SERDES 210. Thus, external signals provided to programmable interconnect circuit 200 may be routed from a low-speed I/O circuit 316 to another low-speed I/O circuit 316, from a low-speed I/O circuit 316 to a SERDES circuit 210, from a SERDES circuit 210 to another SERDES circuit 210, and from a SERDES circuit 210 to a low-speed I/O circuit 316. These various connections may be made independently and simultaneously. Moreover, because of the specialization of the routing structures into SERDES routing structure 220 and low-speed routing structure 230, greater routing flexibility is achieved while minimizing fuse count and die area demands.

Figure 12:
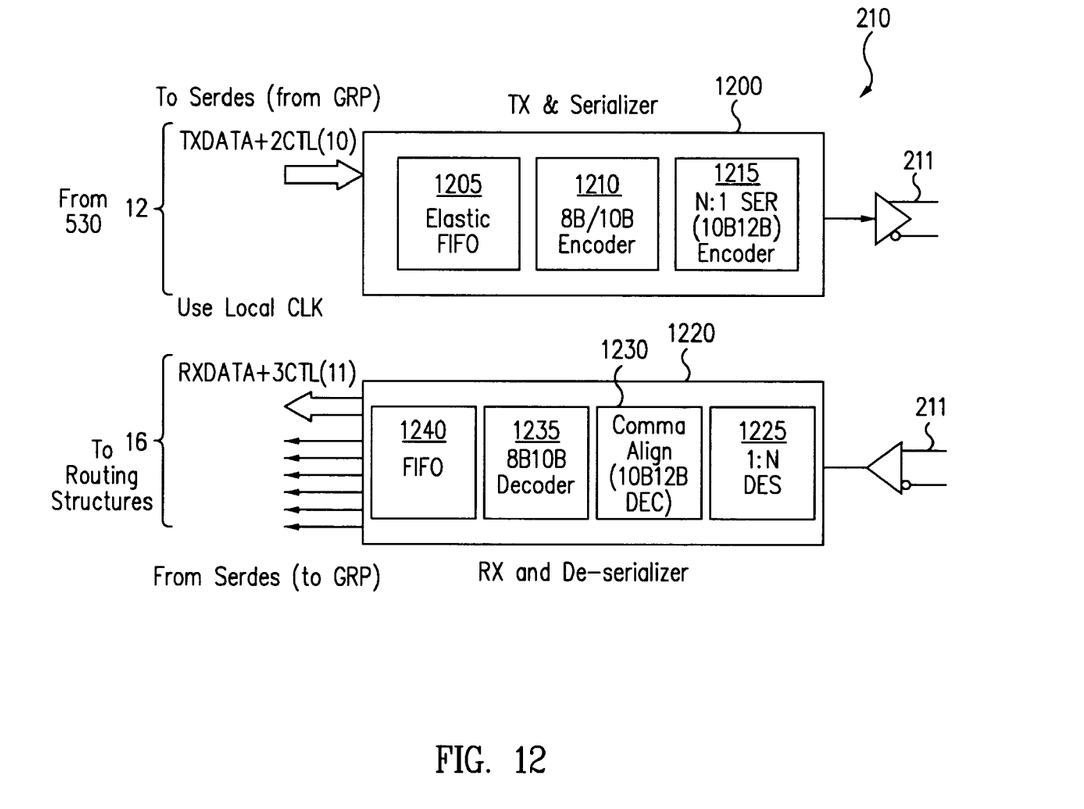
FIG. 12 is a block diagram of an exemplary SERDES for the programmable interconnect circuit of FIGS. 2a and 2b.

These advantages are achieved regardless of the architecture used to implement SERDES 210. An exemplary architecture for a SERDES 210 is illustrated in FIG. 12. A serializer/transmitter 1200 receives 12 signals that includes an 8-bit data word, various control signals, and a clock signal from second level SERDES routing structure 530. In such an embodiment, it may be noted that second level SERDES routing structure 530 was previously discussed as providing sixteen outputs. In that regard, four outputs would be unnecessary. However, using such a number of output signals for second level SERDES routing structure 530 allows the layout developed for second level data-path routing structure 505 to be re-used. Serializer/transmitter 1200 includes an elastic FIFO 1205, an 8B/10B encoder 1210, and an N:1 serializer 1215. Similarly, a de-serializer/receiver 1220 includes a 1:N de-serializer 1225, a comma aligner 1230, an 8B/10 decoder 1235, and a FIFO 1240 to produce an 8-bit data word and various control signals. Any suitable protocol may be implemented in SERDES 210 such as low voltage differential signaling (LVDS), current mode logic (CML), and low voltage positive emitter coupled logic (LVPECL).

The I/O protocol implemented in blocks 205 may also be any suitable protocol such as 3.3V low voltage complementary metal oxide semiconductor (LVCMOS), 2.5V LVCMOS, 1.8V LVCMOS, low voltage transistor—transistor logic (LVTTL), stub series terminated logic (SSTL_1.8) Class I/II, SSTL_2 Class I/II, and SSTL_3 Class I/II. Groups of the I/O blocks 205 may be organized into banks as known in the art, wherein each bank shares a power supply voltage and a voltage reference for single-ended signaling.

Those of ordinary skill in the art will appreciate that the programmable interconnect circuit architecture described herein may be implemented in numerous alternative embodiments. For example, the routing structures may be single level or multi-level. The I/O block architecture need not associate each output register with a 4:1 multiplexer. The SERDES standards and I/O protocols may be varied. The programmable interconnect circuit need not comprise dedicated hardware but instead be embodied in a configured programmable logic device. Accordingly, the above-described embodiments of the present invention are merely meant to be illustrative and not limiting. It will thus be obvious to those skilled in the art that various changes and modifications may be made without departing from this invention in its broader aspects. The appended claims encompass all such changes and modifications as fall within the true spirit and scope of this invention.

We claim:

1. A programmable interconnect circuit, comprising:
    a plurality of SERDES circuits dedicated to communicating high-speed data;

a plurality of input/output (I/O) circuits dedicated to communicating low-speed data; and a routing structure configurable to couple a SERDES circuit to another SERDES circuit, a SERDES circuit to an I/O circuit, an I/O circuit to a SERDES circuit, and an I/O circuit to another I/O circuit over routing paths having deterministic routing delays.

2. The programmable interconnect circuit of claim 1, wherein the routing structure includes a high-speed routing structure for communicating high-speed data to and from a SERDES circuit and a low-speed routing structure for communicating low-speed data to and from an I/O circuit.

3. The programmable interconnect circuit of claim 2, wherein the I/O circuits are organized into a plurality of I/O blocks, each I/O block including a subset of the I/O circuits, and wherein the low-speed routing structure comprises a plurality of low-speed routing structures, each low-speed routing structure corresponding to an I/O block.

4. The programmable interconnect circuit of claim 3, wherein each low-speed routing structure comprises a data-path routing structure and a control-path routing structure, the data-path routing structure being configured to provide signals to the output registers in the corresponding I/O block, the control-path routing structure being configured to provide signals to the corresponding I/O block's control array.

5. The programmable interconnect circuit of claim 4, wherein each data-path routing structure comprises a first level data-path routing structure having a partially-populated switch matrix and a second level data-path routing structure, the first level data-path routing structure being configured to receive signals from the plurality of I/O blocks and a plurality of SERDES circuits and to route the received signals into a first plurality of signals, the second level data-path routing structure being configured to receive the first plurality of signals and route them to the corresponding I/O block's output registers.

6. The programmable interconnect circuit of claim 5, wherein each second level data-path routing structure comprises a fully populated switch matrix.

7. The programmable interconnect circuit of claim 1, wherein the routing structure is configurable to provide the couplings simultaneously or alternatively.

8. The programmable interconnect circuit of claim 1, wherein each SERDES circuit is configurable for communicating high-speed data using at least one of LVDS, CML, and LVPECL signaling protocols.

9. The programmable interconnect circuit of claim 1, wherein the interconnect circuit is embodied in a programmable logic device with dedicated low-speed I/O pins associated with the I/O circuits and dedicated high-speed pins associated with the SERDES circuits.

10. The programmable interconnect circuit of claim 1, wherein each I/O circuit includes an output register configured to register a signal from the routing structure and to provide the registered signal to a dedicated low-speed I/O pin and an input register configured to register a signal from the dedicated low-speed I/O pin and provide the registered signal to the routing structure, and wherein each SERDES circuit is associated with a dedicated high-speed I/O pin.

11. The programmable interconnect circuit of claim 1, wherein each I/O circuit is configurable for communicating low-speed data using at least one of LVCMOS, LVTTL, and SSTL signaling protocols.

12. The programmable interconnect circuit of claim 1, wherein the I/O circuits are organized into a plurality of I/O blocks, each I/O block including a control array configured to receive signals from the routing structure and to form product term control signals from the received signals for the control of the I/O block.

13. A programmable interconnect circuit, comprising:

a plurality of SERDES circuits;

a plurality of input/output (I/O) blocks, each I/O block including a plurality of I/O circuits; and a routing structure configurable to receive input signals from the plurality of I/O blocks and the plurality of SERDES circuits and for programmably routing with deterministic delays the received input signals to selected I/O blocks and to selected SERDES circuits.

14. The programmable interconnect circuit of claim 13, wherein each SERDES circuit is configurable for at least one of LVDS, CML, and LVPECL signaling.

15. The programmable interconnect circuit of claim 13, wherein each I/O circuit is configurable for at least one of LVCMOS, LVTTL, and SSTL signaling.

16. A method of programmably routing signals through a programmable interconnect device, comprising:

providing in the device a plurality of SERDES circuits dedicated to communicating high-speed data, a plurality of input/output (I/O) circuits dedicated to communicating low-speed data, and a routing structure configurable to couple any of the I/O circuits or SERDES circuits to any of the other I/O circuits or SERDES circuits over routing paths having deterministic routing delays;

to route a low-speed data signal through the device, configuring the routing structure to couple an I/O circuit to another I/O circuit;

to route a high-speed data signal through the device, configuring the routing structure to couple a SERDES circuit to another SERDES circuit;

to convert a low-speed input data signal to a high-speed output data signal, configuring the routing structure to couple an I/O circuit to a SERDES circuit; and to convert a high-speed input data signal to a low-speed output data signal, configuring the routing structure to couple a SERDES circuit to an I/O circuit.

17. The method of claim 16, wherein each SERDES circuit associates with a dedicated high-speed pin and each I/O circuit associates with a dedicated low-speed pin, the method further comprising:

routing a low-speed data signal through the device from a low-speed pin to another low-speed pin; and routing a high-speed data signal through the device from a high-speed pin to another high-speed pin.

18. The method of claim 16, further comprising simultaneously routing both high-speed and low-speed data through the device.

19. The method of claim 16, further comprising simultaneously converting high-speed input data signals to low-speed output data signals and low-speed input data signals to high-speed output data signals through the device.

20. The method of claim 16, wherein the routing structure includes a high-speed routing structure for communicating high-speed data to and from a SERDES circuit and a low-speed routing structure for communicating low-speed data to and from an I/O circuit.

* * * * *